United States Patent
Chang et al.

(10) Patent No.: US 9,830,979 B1
(45) Date of Patent: Nov. 28, 2017

(54) SYSTEMS AND METHODS FOR CONTROLLING A SENSE AMPLIFIER

(71) Applicant: Taiwan Semiconductor Manufacturing Company Limited, Hsinchu (TW)

(72) Inventors: Chun-Hao Chang, Taichung (TW); Shao-Yu Chou, Hsinchu County (TW); Shawn Chen, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/366,028

(22) Filed: Dec. 1, 2016

Related U.S. Application Data

(60) Provisional application No. 62/341,702, filed on May 26, 2016.

(51) Int. Cl.
  *G11C 7/08* (2006.01)
  *G11C 11/419* (2006.01)
  *G11C 11/412* (2006.01)

(52) U.S. Cl.
  CPC .............. *G11C 11/419* (2013.01); *G11C 7/08* (2013.01); *G11C 11/412* (2013.01)

(58) Field of Classification Search
  CPC ............................... G11C 7/08; G11C 11/4091
  USPC .................................................. 365/208, 205
  See application file for complete search history.

(56) References Cited

U.S. PATENT DOCUMENTS

| | | | | |
|---|---|---|---|---|
| 6,459,317 B1* | 10/2002 | Lu | .......................... | G11C 7/065 327/217 |
| 2006/0262619 A1* | 11/2006 | Vernet | ................. | G11C 11/4091 365/205 |
| 2011/0128797 A1* | 6/2011 | Hong | ....................... | G11C 7/02 365/189.05 |
| 2011/0216610 A1* | 9/2011 | Maeda | ..................... | G11C 5/14 365/189.16 |
| 2013/0193507 A1* | 8/2013 | Yoshida | .............. | G11C 11/4091 257/329 |
| 2013/0223164 A1* | 8/2013 | Ozoe | ........................ | G11C 7/06 365/189.011 |
| 2014/0010032 A1* | 1/2014 | Seshadri | ................... | G11C 7/12 365/203 |
| 2014/0071745 A1* | 3/2014 | Kawasumi | .......... | G11C 11/1673 365/158 |
| 2014/0376318 A1* | 12/2014 | Ferrant | .................. | G11C 7/062 365/189.11 |

(Continued)

*Primary Examiner* — Michael Tran
(74) *Attorney, Agent, or Firm* — Jones Day

(57) ABSTRACT

Systems and methods for controlling a sense amplifier are provided. First and second MOS transistors of a first type are connected in series between a first voltage potential and a node. A gate terminal of the first MOS transistor is coupled to a first data. A gate terminal of the second MOS transistor is coupled to a second data line. A third MOS transistor of a second type is connected between the node and a second voltage potential. The third MOS transistor has a gate terminal coupled to the first data line. A fourth MOS transistor of the second type is connected between the node and the second voltage potential in a parallel arrangement with the third MOS transistor. The fourth MOS transistor has a gate terminal coupled to the second data line. A control signal provided to a sense amplifier is based on a voltage of the node.

20 Claims, 2 Drawing Sheets

(56) References Cited

U.S. PATENT DOCUMENTS

| | | | |
|---|---|---|---|
| 2015/0170730 A1* | 6/2015 | Antonyan | G11C 11/4099 365/189.07 |
| 2015/0255138 A1* | 9/2015 | Rodriguez-Latorre | G06F 11/1008 714/766 |
| 2016/0049179 A1* | 2/2016 | La Rosa | G11C 7/08 365/189.05 |
| 2016/0118140 A1* | 4/2016 | Tsujihashi | G11C 29/025 365/189.02 |

* cited by examiner

SYSTEMS AND METHODS FOR CONTROLLING A SENSE AMPLIFIER

CROSS-REFERENCE TO RELATED APPLICATIONS

This application claims priority to U.S. Provisional Patent Application No. 62/341,702, filed May 26, 2016, entitled "Control Scheme for Sense Amplifier," which is incorporated herein by reference in its entirety.

BACKGROUND

Memory cells are commonly used to store data bits. A single memory cell may be referred to as a bit cell because the memory cell stores one bit of information. For example, a static random access memory (SRAM) memory cell stores one bit of information represented by a logic state of two cross-coupled inverters. As another example, an antifuse memory cell stores one bit of information represented by whether the antifuse is conducting or non-conducting. Memory arrays include multiple bit cells arranged in rows and columns. In some approaches, bit cells of the array are coupled to a plurality of word lines and a plurality of bit lines, with the word lines and bit lines being configured to control access to the bit cells of the array.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
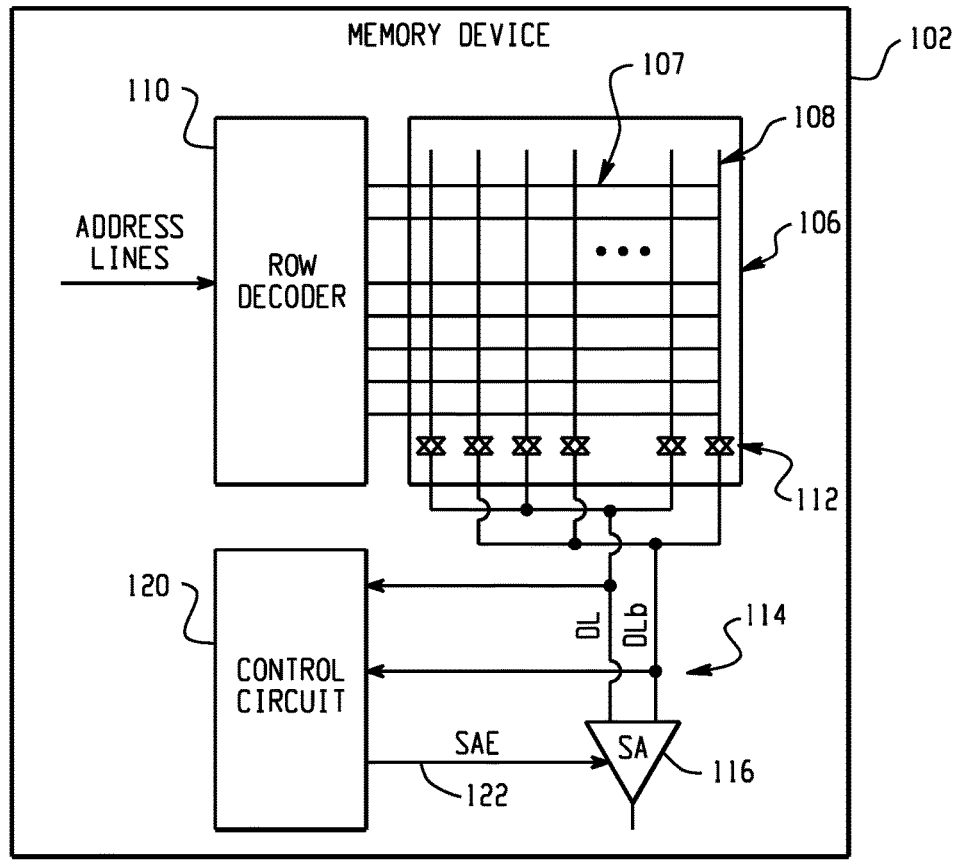
FIG. 1 depicts a block diagram of a memory device including a sense amplifier and a control circuit for controlling the sense amplifier, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 depicts a block diagram of a memory device 102 including a sense amplifier 116 and a control circuit 120 for activating the sense amplifier 116, in accordance with some embodiments. The memory device 102 includes a memory array 106 having a plurality of memory cells configured to store data. The memory cells are connected to one or more periphery circuits (e.g., row decoder 110, plurality of multiplexors 112, and sense amplifier 116) by way of a plurality of word lines (WL) 107 and bit lines 108, which are configured to control access to the memory cells of the array 106. The bit lines 108 include a plurality of bit line (BL) and bit line bar (BLb) lines.

The memory cells of the array 106 are configured to store bit information. To read the bit information from a memory cell of the array 106 (e.g., to perform a read operation), the row decoder 110 is configured to select one of the word lines 107, and the plurality of multiplexors 112 are configured to select a bit line BL and a bit line bar BLb. The word line and bit line combination defines a cell address, which upon being accessed provides charge on two differential data lines 114, data line (DL) and data line bar (DLb). Specifically, in embodiments, a memory cell of the array 106 is configured to receive a signal on a word line WL, which causes the memory cell to selectively transfer bit information from the memory cell to a corresponding bit line BL and bit line bar BLb. The multiplexers 112 (i) couple the selected bit line BL to the data line DL, and (ii) couple the selected bit line bar BLb to the data line DLb. The DL and DLb lines 114 are coupled to the sense amplifier 116, as shown in the figure.

The sense amplifier 116 is configured to sense a logic state of the selected memory cell based on the voltages present on the DL and DLb lines 114. In examples, the sense amplifier 116 senses a voltage differential (i.e., $\Delta V$) on the DL and DLb lines 114 and generates an output indicative of data stored in the selected memory cell of the memory array 106. In this manner, a read operation is performed. In embodiments, the sense amplifier 116 only senses the voltage differential on the DL and DLb lines 114 in response to a sense amplifier enable (SAE) signal 122 received from a control circuit 120. For instance, in embodiments, the sense amplifier 116 senses the voltage differential on the DL and DLb lines 114 in response to an edge (e.g., a falling edge, a rising edge, etc.) of the SAE signal 122.

In embodiments, prior to performing the read operation, voltage levels of the bit line BL, bit line bar BLb, data line DL, and data line bar DLb are set to a reference voltage with a logically low value. The setting of the BL, BLb, DL, and DLb lines to the logically low reference voltage is performed, in examples, by a pre-discharge circuit of the memory device 102. The pre-discharge circuit is configured, in embodiments, to discharge the BL, BLb, DL, and DLb lines to the logically low reference voltage in response to a pre-discharge signal. An example pre-discharge circuit is described in U.S. Pat. No. 9,281,056, which is incorporated herein by reference in its entirety.

During a read operation, the sense amplifier 116 is configured to detect an increase in the voltage level on the data line DL or data line bar DLb above the logically low reference voltage. For instance, in embodiments, the DL and DLb lines 114 are in a pre-discharge state of VSS (e.g., ground reference voltage) prior to the assertion of a strobe signal (also known as a bit select signal). The pre-discharge state of the DL and DLb lines 114 is synchronized to the strobe signal, in examples. Thus, when the strobe signal is asserted, the pre-discharge state is turned off, the BL line is coupled to the DL line, and the BLb line is coupled to the DLb line. As a result of this coupling, one of DL and DLb is forced high, while the other of DL and DLb is held at VSS. The sense amplifier 116 senses the increase in voltage on one of the data lines DL and DLb and generates an output indicative of data stored in the selected memory cell. In embodiments, the sense amplifier 116 comprises cross-coupled inverters having one or more sets of paired transistor devices. In other embodiments, other types of sense amplifier configurations are utilized.

As noted above, the memory cells of the array 106 are configured to store bit information. In some embodiments, the array 106 includes one-time programmable (OTP) memory cells, such as antifuses. An antifuse is blown by applying a higher-than-normal voltage or laser beam to the antifuse, in examples. The high voltage, for example, produces a short circuit where an open circuit once existed. The application of the laser beam creates a similar short circuit condition. The blown antifuse alters a high impedance situation to a current conducting path that effects a change in a logic level with an applied current.

The antifuse generally comprises two conductors and some kind of dielectric or insulating material between the two conductors. In recent practice, the dielectric is set to approximately half the normal thickness of a thin oxide field-effect transistor (FET) gate. In the presence of high voltage or laser power, the thin oxide is electrically broken down to change from a non-conducting to a conducting condition. Thus, in embodiments where the memory array 106 includes antifuses, the sense amplifier 116 is used to determine whether an antifuse memory cell of the array 106 is non-conducting or conducting, which is indicative of a bit of data stored in the memory cell.

It is noted that the memory array 106 can include types of memory cells other than antifuses. In some embodiments, the memory array 106 includes static random access memory (SRAM) cells, for instance. In some embodiments, the memory cells of the array 106 include transistors having three dimensional gate structures, e.g., FinFETs, etc. The approaches of the instant disclosure are applicable in all memory devices in which a state of a memory cell is represented on a pair of differential lines (e.g., differential BL/BLb lines, differential DL/DLb lines, etc.).

According to the approaches of the instant disclosure, in embodiments, the memory device 102 includes the aforementioned control circuit 120, which is coupled to the DL and DLb lines 114. Based on signals received via the DL and DLb lines 114 (e.g., voltage signals, etc.), the control circuit 120 is configured to generate the SAE signal 122. In some embodiments, the SAE signal 122 comprises a voltage that transitions from a first logic level (e.g., a logic level high) to a second logic level (e.g., a logic level low) in order to activate the sense amplifier 116. When activated by the SAE signal 122, the sense amplifier 116 senses a voltage differential on the DL and DLb lines 114 and generates an output indicative of data stored in a memory cell of the memory array 106, as described above.

In embodiments, the control circuit 120 includes low threshold voltage (LVT) or ultra-low threshold voltage (uLVT) metal oxide semiconductor (MOS) transistors that are configured to change states (e.g., turn on, turn off) in response to a relatively small change in voltage on the DL or DLb line. As described in further detail below, this change in state of the LVT or uLVT MOS transistor in the control circuit 120 causes the SAE signal 122 to transition from a first logic level to a second logic level, which activates the sense amplifier 116. The use of the LVT or uLVT MOS transistors to activate the sense amplifier 116 based on the relatively small change in voltage on the DL or DLb line enables read operations to be performed in a relatively small amount of time. As referred to herein, an LVT MOS transistor is a MOS transistor having a relatively low threshold voltage (e.g., 0.2 V). As referred to herein, an uLVT MOS transistor is a MOS transistor having a threshold voltage that is lower than that of the LVT MOS transistor (e.g., <0.2 V).

In embodiments, the control circuit 120 includes (i) a first LVT or uLVT MOS transistor having a gate terminal that is coupled to the data line DL, and (ii) a second LVT or uLVT MOS transistor having a gate terminal that is coupled to the data line bar DLb. Prior to a read operation, the DL and DLb lines are set to a logically low reference voltage, as described above, and as a result, the first and second LVT or uLVT MOS transistors are in a first state (e.g., an "off" state). When the read operation is performed, one of DL and DLb is forced high, while the other of DL and DLb is held at the logically low reference voltage, as described above. Because the LVT or uLVT MOS transistors have a relatively low threshold voltage, a relatively small increase in voltage on one of the DL and DLb lines causes one of the first and second transistors to transition from the first state to a second state (e.g., an "on" state). As described below, the transition from the first state to the second state causes the SAE signal 122 to transition from a first logic level to a second logic level, thus activating the sense amplifier 116. The sense amplifier 116 detects the relatively small voltage increase on one of the DL and DLb lines 114 as a differential voltage on these lines 114, thus enabling the read operation to be performed.

In some embodiments, the MOS transistors used to activate the sense amplifier 116 are standard threshold voltage (SVT) MOS transistors. As referred to herein, an SVT MOS transistor is a MOS transistor having a standard threshold voltage (e.g., 0.3 V) that is higher than that of the LVT MOS transistor. The use of such SVT transistors can require a longer amount of time t0 activate the sense amplifier 116, as compared to the approaches described herein using the LVT and uLVT MOS transistors. Specifically, in examples using SVT MOS transistors to activate the sense amplifier 116, a larger change in voltage on the DL or DLb line is required for the SVT MOS transistor to change states, as compared to an LVT or uLVT MOS transistor. Thus, activation of the sense amplifier 116 is delayed in comparison to the approaches that utilize the LVT and uLVT MOS transistors.

The approaches of the instant disclosure differ from conventional approaches. In the conventional approaches, delay circuits are used to provide an activation signal to activate the sense amplifier. As described above, in embodiments, when a read operation is performed in a memory device, one of DL and DLb is forced high. Due to the relatively small cell currents utilized in memory devices, DL or DLb is typically forced high in a relatively slow manner. Recognizing this, in the conventional approaches, a delay circuit is used to delay the activation of the sense amplifier, such that DL or DLb is allowed to rise to a voltage value that is detectable by the sense amplifier prior to activating the sense amplifier. Thus, for instance, in conventional approaches, following the assertion of a strobe signal (e.g., a bit select signal) for a read operation, the delay circuit implements a delay for an amount of time and then provides the activation signal for activating the sense amplifier.

The conventional approaches are deficient in several respects. For instance, the delay circuit is typically implemented using an inverter chain, and such inverter chains often require a large area and have a high power consumption. Further, for instance, a delay time of the delay circuit may be subject to process, voltage, and temperature (PVT)

variation, and the PVT variation can cause the delay time t0 be too short or too long. If the delay time is too short, the sense amplifier can be activated too early, such that it cannot detect the differential voltage on the DL and DLb lines. For example, the differential voltage at the time of activation of the sense amplifier can be at a level that is too small to be detected by the sense amplifier. If the delay time is too long, an amount of time for performing the read operation is longer than required, which is undesirable.

In contrast to these conventional approaches, under the approaches of the instant disclosure, a delay circuit is not utilized to activate the sense amplifier 116. Rather, in embodiments described herein, transistors (e.g., LVT or uLVT MOS transistors) are used to activate the sense amplifier 116. These transistors receive the voltages of the DL and DLb lines 114 at respective gate terminals and change states (e.g., turn on, turn off) in response to relatively small changes in voltage on the DL and DLb lines 114, as described above. When one of the transistors changes state, the SAE signal 122 transitions from a first logic level to a second logic level, thus activating the sense amplifier 116.

It is noted that the sense amplifier 116 is capable of detecting relatively small voltage differentials on the DL and DLb lines 114. Thus, any change in voltage on the DL or DLb line that is high enough to trigger a change in state of a MOS transistor (e.g., LVT MOS transistor, uLVT MOS transistor, etc.) of the control circuit 120 can be detected by the sense amplifier 116 as a differential voltage on the data lines 114. Accordingly, under the approaches of the instant disclosure, the sense amplifier 116 is not activated at too early a time. In other words, the differential voltage on the DL and DLb data lines 114 at the time of activation of the sense amplifier 116 is not at a level that is too small to be detected by the sense amplifier 116.

Figure 2:
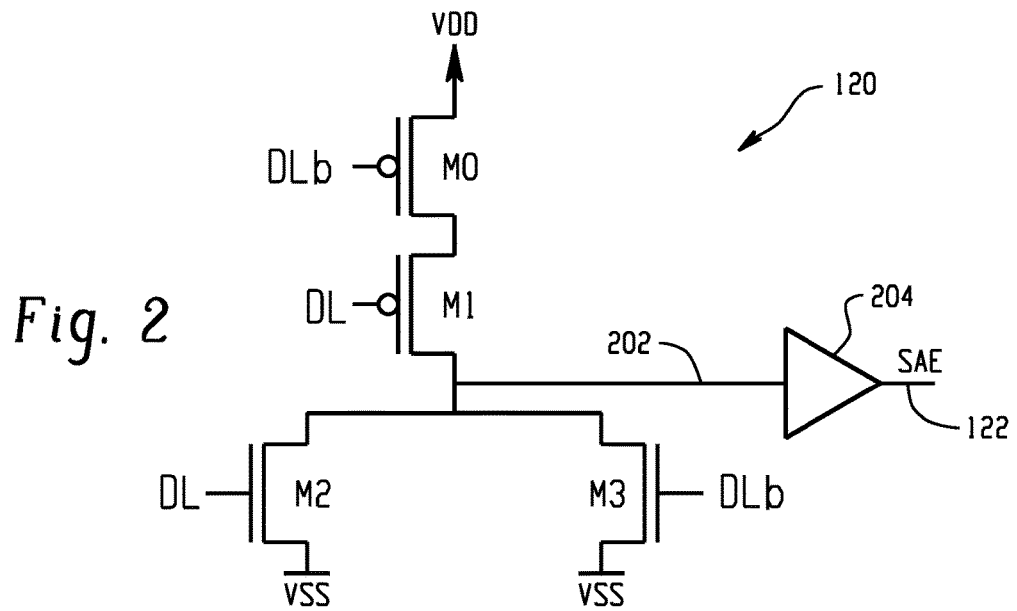
FIG. 2 depicts an embodiment of the control circuit of FIG. 1, in accordance with some embodiments.

FIG. 2 depicts an embodiment of the control circuit 120 of FIG. 1, in accordance with some embodiments. As described above with reference to FIG. 1, the control circuit 120 is used to generate the sense amplifier enable (SAE) signal 122, which activates the sense amplifier 116. Specifically, in embodiments, in response to an edge (e.g., a falling edge, a rising edge, etc.) of the SAE signal 122, the sense amplifier 116 senses a voltage differential on the DL and DLb lines 114 and generates an output indicative of data stored in the selected memory cell of the memory array 106. The activation of the sense amplifier 116 in this manner thus enables read operations to be performed.

The control circuit 120 of FIG. 2 includes first and second metal oxide semiconductor (MOS) transistors M0, M1 connected in series between a first voltage potential VDD and a node 202. As shown in the figure, a gate terminal of the first MOS transistor M0 is coupled to the DLb data line of the differential data lines 114, and a gate terminal of the second MOS transistor M1 is coupled to the DL data line. As described above with reference to FIG. 1, the DL and DLb data lines 114 are coupled to inputs of a sense amplifier (e.g., the sense amplifier 116 of FIG. 1). In the example of FIG. 2, the transistors M0, M1 are of a same type, i.e., p-type metal oxide semiconductor (PMOS).

The control circuit 120 of FIG. 2 further includes a third MOS transistor M2 connected between the node 202 and a second voltage potential VSS (e.g., ground reference voltage). The third MOS transistor M2 has a gate terminal coupled to the DL data line. A fourth MOS transistor M3 is connected between the node 202 and the second voltage potential VSS in a parallel arrangement with the third MOS transistor M2, as shown in the figure. In the example of FIG. 2, the transistors M2, M3 are of a same type, i.e., n-type metal oxide semiconductor (NMOS). The type of the transistors M2, M3 (i.e., NMOS, in the example of FIG. 2) is different than the type of the transistors M0, M1 (i.e., PMOS, in the example of FIG. 2).

The third and fourth MOS transistors M2, M3 each have a threshold voltage that is less than the threshold voltages of the first and second MOS transistors M0, M1. Thus, in embodiments, the third and fourth MOS transistors M2, M3 are LVT or uLVT MOS transistors, and the first and second MOS transistors M0, M1 are SVT MOS transistors. In these embodiments, the control circuit 120 may be referred to as a "mixed VT control circuit" because the circuit 120 uses transistors having a relatively low threshold voltage and transistors having a threshold voltage that is higher than the relatively low threshold voltage. LVT, uLVT, and SVT MOS transistors are described above with reference to FIG. 1.

It is noted that the scope of the instant disclosure is not limited to embodiments described herein where the third and fourth MOS transistors M2, M3 are LVT or uLVT transistors, and the first and second MOS transistors M0, M1 are SVT transistors. For instance, in embodiments, the third and fourth MOS transistors M2, M3 are "extreme low Vt" MOS transistors, and the first and second MOS transistors M0, M1 are LVT or uLVT MOS transistors. As referred to herein, an "extreme low Vt" MOS transistor is a MOS transistor having a threshold voltage that is lower than that of the uLVT MOS transistor. Thus, under the approaches of the instant disclosure, the third and fourth MOS transistors M2, M3 can be any type of MOS transistor (e.g., SVT, LVT, uLVT, extreme low Vt, etc.) having threshold voltages that are lower than the threshold voltages of the first and second MOS transistors M0, M1.

The node 202 is coupled to a buffer circuit 204. In embodiments, the node 202 has a relatively small driving capability, and thus, the buffer circuit 204 is used to provide an increased driving capability for the SAE signal 122. The buffer circuit 204 generates the SAE signal 122 that is provided to the sense amplifier 116 and used in activating the sense amplifier 116. In some embodiments, the SAE signal 122 is based on the voltage of the node 202, which transitions from a first logic level (e.g., a logic level high) to a second logic level (e.g., a logic level low) in order to activate the sense amplifier 116. When activated by the SAE signal 122, the sense amplifier 116 senses a voltage differential on the DL and DLb lines 114 and generates an output based on the voltage differential.

Figure 3:
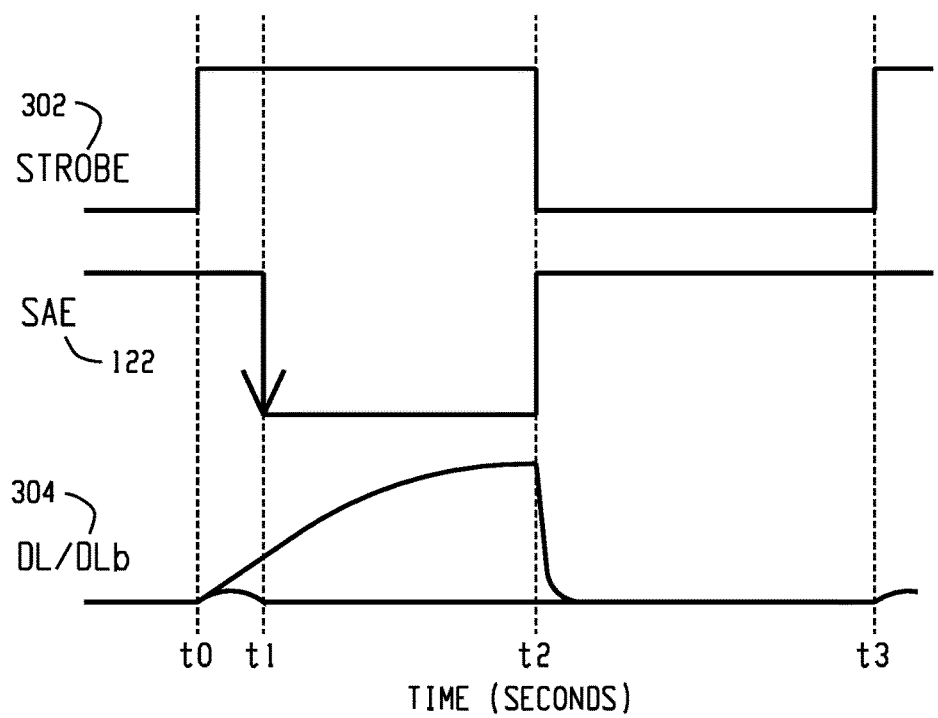
FIG. 3 depicts an example signal timing diagram for a memory device, in accordance with some embodiments.

To describe the use of the control circuit 120 in performing a read operation in a memory device, reference is made to FIG. 3. This figure depicts an example signal timing diagram, in accordance with some embodiments. An x-axis of the signal timing diagram represents time (e.g., in seconds), and signals represented by the timing diagram include a strobe signal 302 (e.g., a bit select signal), the sense amplifier enable (SAE) signal 122, and voltage signals 304 on the DL and DLb data lines.

In the embodiment of FIG. 3, prior to performing a read operation, voltage levels of the DL and DLb lines are set (e.g., discharged) to a logic level low reference voltage. Thus, as seen in the figure, prior to a time t0, the DL and DLb lines have the logic level low reference voltage. With reference to FIG. 2, when the DL and DLb lines have the logic level low reference voltage, the transistors M0, M1 are in an "on" state (e.g., able to conduct current), and the transistors M2, M3 are in an "off" state (e.g., not able to conduct current).

The different behavior of the first and second transistors M0, M1 in comparison to the second and third transistors M2, M3 is a result of the different transistor types utilized for the respective pairs of transistors. Specifically, in the embodiment of FIG. 2, the transistors M0, M1 are PMOS transistors, such that the logic level low reference voltage of the DL and DLb lines causes these transistors to be in the "on" state prior to the read operation. Conversely, the transistors M2, M3 are NMOS transistors, such that the logic level low reference voltage of the DL and DLb lines causes these transistors to be in the "off" state prior to the read operation.

With the transistors M0, M1, M2, M3 in the above-described states (i.e., M0, M1 are turned on, and M2, M3 are turned off), the node 202 has a logic level high voltage prior to the read operation. This can be seen in the signal timing diagram of FIG. 3. As described above, the SAE signal 122 is based on a voltage of the node 202. Accordingly, as seen in FIG. 3, prior to the time t0, the SAE signal 122 has a logic level high voltage, consistent with the logic level high voltage of the node 202 during this period of time.

At the time t0, the strobe signal 302 is asserted, and as a result, the DL line is coupled to a BL line, and the DLb line is coupled to a BLb line. As a result of this coupling, one of DL and DLb is forced high, while the other of DL and DLb is held at the logic level low reference voltage. This can be seen in FIG. 3, which depicts a voltage level of one of the DL and DLb lines beginning to rise at the time t0, and a voltage level of the other of the DL and DLb lines remaining low.

With reference again to FIG. 2, as a result of the voltage level of one of the DL and DLb lines increasing, one of M2 and M3 changes from the "off" state to the "on" state, i.e., turns on. More specifically, when the increase in voltage on the DL or DLb line reaches the threshold voltage of M2 or M3, this causes one of M2 and M3 to turn on. As described above, in embodiments, the transistors M2, M3 are LVT or uLVT transistors having relatively low threshold voltages, and accordingly, a relatively small increase in voltage on one of the DL and DLb lines causes one of M2 and M3 to turn on.

When one of M2 and M3 turns on in response to the increase in voltage level on the DL or DLb line, this provides a path to ground for the current flowing through M0 and M1, such that the voltage at the node 202 is pulled low, i.e., from the logic level high voltage to a logic level low voltage. This can be seen in the signal timing diagram of FIG. 3. As described above, the SAE signal 122 is based on the voltage of the node 202. Accordingly, as seen in FIG. 3, the SAE signal 122 transitions from the logic level high voltage to a logic level low voltage at a time t1. The transition (i.e., the edge) in the SAE signal 122 at the time t1 activates the sense amplifier 116 and causes the sense amplifier to sense a voltage differential on the DL and DLb lines.

It is noted that in examples, the activation of the sense amplifier 116 is in response to a relatively small increase in voltage on one of the DL and DLb lines. In embodiments, the activation of the sense amplifier 116 based on the relatively small increase in voltage is enabled through the use of the LVT or uLVT MOS transistors M2, M3. Because such transistors have a relatively low threshold voltage, a relatively small increase in voltage on one of the DL and DLb lines causes one of these transistors to turn on, which pulls the node 202 low and thus provides a falling edge on the SAE signal 122 for activating the sense amplifier 116. Accordingly, an amount of time required for performing a read operation is reduced through the use of the LVT or uLVT transistors.

It is noted that the sense amplifier 116 is capable of detecting relatively small voltage differentials on the DL and DLb lines 114. Thus, any change in voltage on the DL or DLb line that is high enough to turn on one of M2 and M3 can be detected by the sense amplifier 116 as a differential voltage on the data lines 114. Accordingly, under the approaches of the instant disclosure, the sense amplifier 116 is not activated at too early a time. In other words, the differential voltage on the DL and DLb data lines 114 at the time of activation of the sense amplifier 116 is not at a level that is too small to be detected by the sense amplifier 116.

In some embodiments, the transistors M2, M3 are implemented using SVT transistors. However, the use of such SVT transistors can require a longer amount of time t0 activate the sense amplifier 116, as compared to the approaches described herein using the LVT and uLVT MOS transistors. Specifically, in examples that implement the MOS transistors M2, M3 with SVT MOS transistors, a larger change in voltage on the DL or DLb line is required for the transistor M2 or M3 to change states. Thus, activation of the sense amplifier 116 is delayed in comparison to the approaches that utilize LVT or uLVT MOS transistors.

As described above, at the time t0, one of DL and DLb is forced high. With reference again to FIG. 2, as a result of the voltage level of one of the DL and DLb lines increasing, one of M0 and M1 changes from the "on" state to the "off" state, i.e., turns off. More specifically, when the increase in voltage on the DL or DLb line reaches the threshold voltage of M0 or M1, this causes one of M0 and M1 to turn off. As described above, in embodiments, the transistors M0, M1 have higher threshold voltages than those of the transistors M2, M3. Accordingly, the turning off of one of the transistors M0, M1 occurs after the turning on of one of the transistors M2, M3. The turning off of one of the transistors M0, M1 creates an open circuit in the upper branch of the control circuit 120 (i.e., the upper branch formed between the first voltage potential VDD and the node 202), and thus terminates all current flow in the circuit. As described above, when one of M2 and M3 turns on, the voltage at the node 202 is pulled low. The subsequent termination of the current flow that occurs when one of M0 and M1 is turned off thus ensures that the node 202 stays low.

At a time t2, the strobe signal 302 is de-asserted, which resets (e.g., discharges) the voltage levels of the DL and DLb lines to the logic level low reference voltage. When DL and DLb have the logic level low reference voltage, this causes the SAE signal 122 to have the logic level high voltage, as described above. A subsequent assertion of the strobe signal 302 at a time t3 enables a second read operation to be performed, similar to the first read operation described above.

It is noted that the example control circuit 120 depicted in FIG. 2 utilizes only four transistors. The four transistors require relatively little area, enable relatively simple circuit routing, and consume a relatively low amount of power. Further, the control circuit 120 consumes only dynamic power (e.g., power is only consumed when the SAE signal 122 has a rising or falling edge) and does not consume static power.

Figure 4:
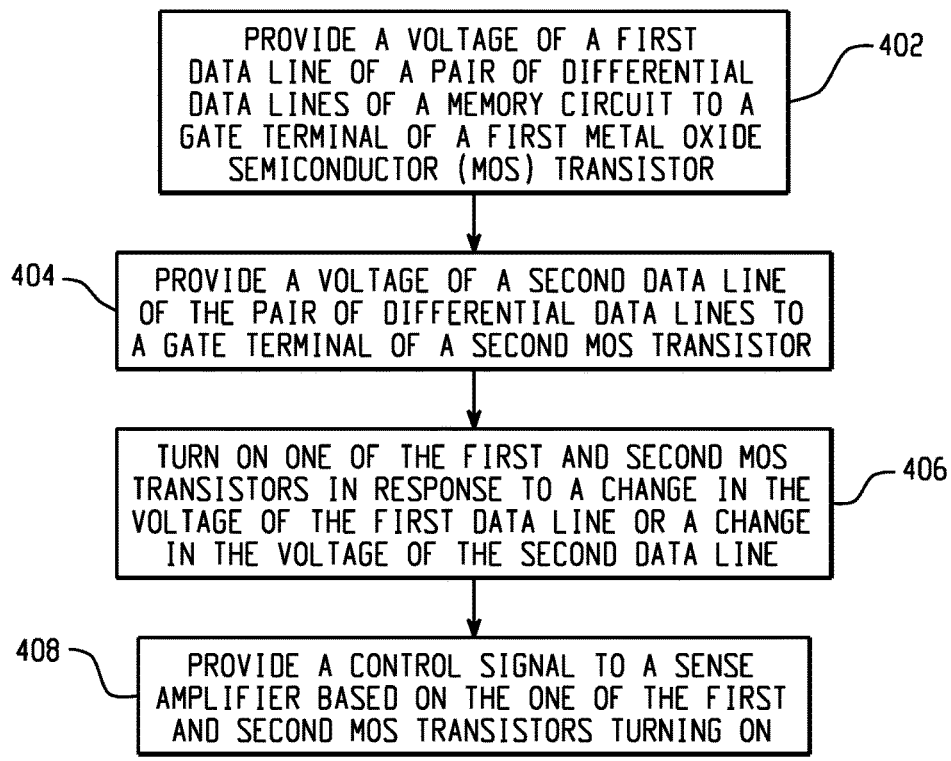
FIG. 4 is a flowchart depicting steps of an example method for generating a control signal for a sense amplifier, in accordance with some embodiments.

FIG. 4 is a flowchart depicting steps of an example method for generating a control signal for a sense amplifier, in accordance with some embodiments. FIG. 4 is described with reference to FIGS. 1 and 2 above for ease of understanding. But the process of FIG. 4 is applicable to other hardware arrangements as well. At 402, a voltage of a first data line (e.g., DL) of a pair of differential data lines DL, DLb of a memory circuit 102 is provided to a gate terminal of a first metal oxide semiconductor (MOS) transistor (e.g., M2). At 404, a voltage of a second data line (e.g., DLb) of the pair of differential data lines is provided to a gate terminal of a second MOS transistor (e.g., M3). At 406, one of the first and second MOS transistors is turned on in response to a change in the voltage of the first data line or a change in the voltage of the second data line. At 408, a control signal 122 is provided to a sense amplifier 116 based on the one of the first and second MOS transistors turning on. It is noted that in embodiments, some of the steps 402-408 of FIG. 4 are performed simultaneously and not necessarily sequentially, and that in embodiments, the ordering of the steps 402-408 varies from that depicted in the figure.

The present disclosure is directed to systems and methods for controlling a sense amplifier of a memory device. An example control circuit for a sense amplifier includes first and second metal oxide semiconductor (MOS) transistors of a first type connected in series between a first voltage potential and a node. A gate terminal of the first MOS transistor is coupled to a first data line of a pair of differential data lines of a memory circuit. A gate terminal of the second MOS transistor is coupled to a second data line of the pair of differential data lines. The control circuit also includes a third MOS transistor of a second type connected between the node and a second voltage potential. The third MOS transistor has a gate terminal coupled to the first data line. The control circuit further includes a fourth MOS transistor of the second type connected between the node and the second voltage potential in a parallel arrangement with the third MOS transistor. The fourth MOS transistor has a gate terminal coupled to the second data line. A control signal provided to a sense amplifier is based on a voltage of the node.

Another example control circuit for a sense amplifier includes a first metal oxide semiconductor (MOS) transistor including a gate terminal coupled to a first data line of a pair of differential data lines of a memory circuit. The control circuit also includes a second MOS transistor including a gate terminal coupled to a second data line of the pair of differential data lines. The control circuit further includes a node that is coupled to the first and second MOS transistors. A transition of one of the first and second MOS transistors from a first state to second state causes a change in voltage at the node. The change in voltage comprises a control signal provided to a sense amplifier.

In an example method for controlling a sense amplifier of a memory device, a voltage of a first data line of a pair of differential data lines of a memory circuit is provided to a gate terminal of a first metal oxide semiconductor (MOS) transistor. A voltage of a second data line of the pair of differential data lines is provided to a gate terminal of a second MOS transistor. One of the first and second MOS transistors is turned on in response to a change in the voltage of the first data line or a change in the voltage of the second data line. A control signal is provided to a sense amplifier based on the one of the first and second MOS transistors turning on.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A control circuit for a sense amplifier comprising:
first and second metal oxide semiconductor (MOS) transistors of a first type connected in series between a first voltage potential and a node, a gate terminal of the first MOS transistor coupled to a first data line of a pair of differential data lines of a memory circuit, and a gate terminal of the second MOS transistor coupled to a second data line of the pair of differential data lines;
a third MOS transistor of a second type connected between the node and a second voltage potential, the third MOS transistor having a gate terminal coupled to the first data line; and
a fourth MOS transistor of the second type connected between the node and the second voltage potential in a parallel arrangement with the third MOS transistor, the fourth MOS transistor having a gate terminal coupled to the second data line, a control signal provided to a sense amplifier being based on a voltage of the node.

2. The control circuit of claim 1,
wherein the third MOS transistor has a threshold voltage that is less than those of the first and second MOS transistors, and
wherein the fourth MOS transistor has a threshold voltage that is less than those of the first and second MOS transistors.

3. The control circuit of claim 1,
wherein the first and second MOS transistors are standard threshold voltage (SVT) transistors, and
wherein the third and fourth MOS transistors are low threshold voltage (LVT) or ultra-low threshold voltage (uLVT) transistors.

4. The control circuit of claim 1, wherein the first type is p-type metal oxide semiconductor (PMOS) and the second type is n-type metal oxide semiconductor (NMOS).

5. The control circuit of claim 1, wherein the first data line is a data line (DL) of the memory circuit, and the second data line is a data line bar (DLb) of the memory circuit, the DL and DLb being coupled to inputs of the sense amplifier.

6. A control circuit for a sense amplifier comprising:
a first metal oxide semiconductor (MOS) transistor including a gate terminal coupled to a first data line of a pair of differential data lines of a memory circuit;
a second MOS transistor including a gate terminal coupled to a second data line of the pair of differential data lines, wherein the first and second MOS transistors are low threshold voltage (LVT) or ultra-low threshold voltage (uLVT) transistors having respective threshold voltages that are less than that of a standard threshold voltage (SVT) transistor; and
a node that is coupled to the first and second MOS transistors, wherein a transition of one of the first and second MOS transistors from a first state to second state causes a change in voltage at the node, a control signal provided to a sense amplifier being based on the change in voltage.

7. The control circuit of claim 6, wherein the transition is in response to a change in voltage on the first data line or the second data line.

8. The control circuit of claim 6,
wherein the first MOS transistor is connected between the node and a first voltage potential, and wherein the second MOS transistor is connected between the node and the first voltage potential in a parallel arrangement with the first MOS transistor.

9. The control circuit of claim 8, wherein the first and second MOS transistors are of a same first type, the control circuit further comprising:
third and fourth MOS transistors of a second type connected in series between a second voltage potential and the node, a gate terminal of the third MOS transistor coupled to the first data line, and a gate terminal of the fourth MOS transistor coupled to the second data line.

10. The control circuit of claim 9, wherein
the third and fourth MOS transistors are SVT transistors having respective threshold voltages that are greater than those of the first and second MOS transistors.

11. The control circuit of claim 9, wherein the first type is n-type metal oxide semiconductor (NMOS), and the second type is p-type metal oxide semiconductor (PMOS).

12. The control circuit of claim 6, wherein the first data line is a data line (DL) of the memory circuit, and the second data line is a data line bar (DLb) of the memory circuit, the DL and DLb being coupled to inputs of the sense amplifier.

13. The control circuit of claim 6, wherein the control signal is a sense amplifier enable (SAE) signal, the change in voltage at the node comprising a transition from a first logic level to a second logic level to activate the sense amplifier.

14. A method of generating a control signal for a sense amplifier, the method comprising:
providing a voltage of a first data line of a pair of differential data lines of a memory circuit to a gate terminal of a first metal oxide semiconductor (MOS) transistor, the first MOS transistor being connected between a node and a voltage potential;
providing a voltage of a second data line of the pair of differential data lines to a gate terminal of a second MOS transistor, the second MOS transistor being connected between the node and the voltage potential in a parallel arrangement with the first MOS transistor;
turning on one of the first and second MOS transistors in response to a change in the voltage of the first data line or a change in the voltage of the second data line; and
providing a control signal to a sense amplifier based on the one of the first and second MOS transistors turning on, the control signal comprising a change in voltage at the node from a first logic level to a second logic level.

15. The method of claim 14, wherein the first and second MOS transistors are low threshold voltage (LVT) or ultra-low threshold voltage (uLVT) transistors.

16. A control circuit for a sense amplifier comprising:
a first metal oxide semiconductor (MOS) transistor including a gate terminal coupled to a first data line of a pair of differential data lines of a memory circuit;
a second MOS transistor including a gate terminal coupled to a second data line of the pair of differential data lines; and
a node that is coupled to the first and second MOS transistors, wherein a transition of one of the first and second MOS transistors from a first state to second state causes a change in voltage at the node, a control signal provided to a sense amplifier being based on the change in voltage, the first MOS transistor is connected between the node and a first voltage potential, and the second MOS transistor is connected between the node and the first voltage potential in a parallel arrangement with the first MOS transistor.

17. The control circuit of claim 16, wherein the first and second MOS transistors are low threshold voltage (LVT) or ultra-low threshold voltage (uLVT) transistors having respective threshold voltages that are less than that of a standard threshold voltage (SVT) transistor.

18. The control circuit of claim 16, wherein the first and second MOS transistors are of a same first type, the control circuit further comprising:
third and fourth MOS transistors of a second type connected in series between a second voltage potential and the node, a gate terminal of the third MOS transistor coupled to the first data line, and a gate terminal of the fourth MOS transistor coupled to the second data line.

19. The control circuit of claim 18, wherein
the first and second MOS transistors are low threshold voltage (LVT) or ultra-low threshold voltage (uLVT) transistors, and
the third and fourth MOS transistors are standard threshold voltage (SVT) transistors having respective threshold voltages that are greater than those of the first and second MOS transistors.

20. The control circuit of claim 18, wherein the first type is n-type metal oxide semiconductor (NMOS), and the second type is p-type metal oxide semiconductor (PMOS).

* * * * *